(12) United States Patent
Lee et al.

(10) Patent No.: US 11,091,695 B2
(45) Date of Patent: Aug. 17, 2021

(54) ETCHING COMPOSITION AND ETCHING METHOD USING THE SAME

(71) Applicant: ENF TECHNOLOGY CO., LTD., Yongin-si (KR)

(72) Inventors: Hye Hee Lee, Seoul (KR); Hyeon Woo Park, Yongin-si (KR); Myung Ho Lee, Hwaseong-si (KR); Myung Geun Song, Yongin-si (KR)

(73) Assignee: ENF TECHNOLOGY CO., LTD., Yongin-si (KR)

( * ) Notice: Subject to any disclaimer, the term of this patent is extended or adjusted under 35 U.S.C. 154(b) by 0 days.

(21) Appl. No.: 16/855,864

(22) Filed: Apr. 22, 2020

(65) Prior Publication Data
US 2020/0339879 A1    Oct. 29, 2020

(30) Foreign Application Priority Data

Apr. 24, 2019   (KR) .......................... 10-2019-0047811

(51) Int. Cl.
*C09K 13/06*    (2006.01)

(52) U.S. Cl.
CPC .................................... *C09K 13/06* (2013.01)

(58) Field of Classification Search
None
See application file for complete search history.

(56) References Cited

U.S. PATENT DOCUMENTS

2015/0306266 A1*  10/2015  Burke ..................... A61L 2/186
                                                    422/28

* cited by examiner

*Primary Examiner* — Roberts P Culbert
(74) *Attorney, Agent, or Firm* — McCoy Russell LLP

(57) ABSTRACT

Provided are an etching composition and an etching method using the same, and more particularly, an etching composition for selectively etching a metal nitride film, an etching method of the metal nitride film using the same, and a method of manufacturing a microelectronic device including a process performed using the same.

4 Claims, No Drawings

ETCHING COMPOSITION AND ETCHING METHOD USING THE SAME

CROSS-REFERENCE TO RELATED APPLICATIONS

The present application claims priority to Korean Patent Application No. 10-2019-0047811 filed on Apr. 24, 2019. The entire contents of the above-listed application is hereby incorporated by reference for all purposes.

TECHNICAL FIELD

The following disclosure relates to an etching composition and an etching method using the same, and more particularly, to an etching composition for a metal nitride film, a method of selectively etching the metal nitride film using the same, and a method of manufacturing a microelectronic device including a process performed using the same.

BACKGROUND

In the high-level information society of the 21st century, the semiconductor industry, together with a flat panel display device industry and a secondary battery industry, is a high-tech core industry with an infinite possibility, and has recently been developed to have ultra-fine technology with a pattern of a size of several to several tens of nanometers.

An effective lithography method is required in order to realize such ultra-fine technology. The lithography method generally includes a process of forming a material layer on a semiconductor substrate, coating a photoresist layer on the material layer, exposing and developing the photoresist layer to form a photoresist pattern, and then etching the material layer using the photoresist pattern as a mask.

However, as a size of the pattern to be formed is decreased, it is difficult to form a fine pattern having a good profile only by the general lithography method. Accordingly, a fine pattern may be formed by forming a layer called a "hard mask" between the material layer to be etched and a photoresist film. The hard mask acts as an intermediate film that transfers the fine pattern of the photoresist to the material layer through a selective etching process.

The hard mask is generally made of a titanium-based metal such as titanium or titanium nitride, and is removed by a wet etching process after vias and/or trenches having a dual damascene structure are formed.

Thus, the wet etching process, which is a process effectively removing a metal hard mask and/or a photoresist etching residue without affecting an underlying metal conductive layer and a low dielectric material, is essential.

Since it is necessary to increase an etching degree of a metal nitride film while suppressing an etching degree of a metal film including a metal or a metal alloy particularly according to manufacturing characteristics of a device, the etching process is very important.

The wet etching process is an etching method using an etchant composition that is a liquid corroding and dissolving only a target metal, and an etchant composition mainly containing hydrogen peroxide is used in the wet etching process.

However, decomposition of the hydrogen peroxide is generated due to instability of the hydrogen peroxide, and an etching amount of the metal film including the metal may not be adjusted due to an insufficient etching selectivity of the metal nitride film or the like, such that there is still a problem in securing an etch selection ratio.

SUMMARY

An embodiment of the present invention is directed to providing an etching composition for solving the problems according to the related art as described above, and an etching method using the same.

Another embodiment of the present invention is directed to providing a method of manufacturing a microelectronic device including an etching process performed using the etching composition.

In one general aspect, an etching composition having an effect of preventing corrosion of a metal wiring film and a liner film while selectively etching a metal nitride film includes: sulfuric acid, hydrogen peroxide, organic peroxide represented by the following Formula 1, and water, wherein a content of the organic peroxide is 0.001 to 3 wt % based on a total weight of the etching composition:

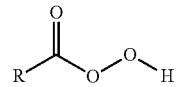

[Formula 1]

wherein

R is hydrogen, $C_1$-$C_3$ alkyl, or $C_6$-$C_{12}$ aryl.

The organic peroxide may be peracetic acid, performic acid, perpropionic acid, or perbenzoic acid, and the organic peroxide and the hydrogen peroxide may have a weight ratio of 1:2 to 55.

The etching composition may include 70 to 90 wt % of sulfuric acid, 0.5 to 5 wt % of hydrogen peroxide, 0.001 to 3 wt % of organic peroxide, and the remaining amount of water.

The etching composition may further include one or two or more additional additives selected from an etch stabilizer, a fluorine-based compound, a glycol-based compound, and a pH adjusting agent.

In another general aspect, an etching method of a metal nitride film using an etching composition of the present invention includes: selectively etching the metal nitride film from a microelectronic device by bringing an etching composition including sulfuric acid, hydrogen peroxide, organic peroxide represented by the following Formula 1, and water into contact with the microelectronic device including the metal nitride film and a metal film; wherein a content of the organic peroxide is 0.001 to 3 wt % based on a total weight of the etching composition:

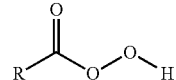

[Formula 1]

wherein

R is hydrogen, $C_1$-$C_3$ alkyl, or $C_6$-$C_{12}$ aryl.

The organic peroxide may be peracetic acid, performic acid, perpropionic acid, or perbenzoic acid, and the organic peroxide and the hydrogen peroxide may have a weight ratio of 1:2 to 55.

The etching composition may include 70 to 90 wt % of sulfuric acid, 0.5 to 5 wt % of hydrogen peroxide, 0.001 to 3 wt % of organic peroxide, and the remaining amount of water, and may further include one or two or more additional additives selected from an etch stabilizer, a fluorine-based compound, a glycol-based compound, and a pH adjusting agent.

The metal nitride film may include one or two or more selected from titanium nitride, tantalum nitride, and titanium tantalum nitride, and the metal film may include one or two or more selected from tungsten, copper, molybdenum, titanium, indium, zinc, tin, and niobium.

In another general aspect, a method of manufacturing a microelectronic device includes: an etching process performed using the etching composition including sulfuric acid, hydrogen peroxide, organic peroxide represented by Formula 1 and water; wherein a content of the organic peroxide is 0.001 to 3 wt % based on a total weight of the etching composition.

The organic peroxide may be peracetic acid, performic acid, perpropionic acid, or perbenzoic acid, and the organic peroxide and the hydrogen peroxide may have a weight ratio of 1:2 to 55.

Other features and aspects will be apparent from the following detailed description and the claims.

DETAILED DESCRIPTION OF EMBODIMENTS

The advantages, features, and aspects of the present invention will become apparent from the following description of the embodiments. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

A "microelectronic device" stated herein corresponds to a semiconductor substrate, a flat panel display device, a phase change memory device, a solar panel, a solar cell device, a photocell, and the other products including a micro electro mechanical systems (MEMS), manufactured in order to be used for microelectronic, an integrated circuit, an energy set, or a computer chip application. It is to be understood that a "microelectronic device", a "microelectronic substrate", and a "microelectronic device structure" stated herein are not restrictive, and include any substrate or structure that will eventually become a microelectronic device or microelectronic assembly. The microelectronic device may be patterned, blanketed, and may be a contrast and/or test device.

A "hard mask" stated herein corresponds to a material deposited on a dielectric material to be protected during a plasma etching step. A hard mask layer is typically made of silicon nitride, silicon oxynitride, titanium nitride, titanium oxynitride, titanium, and the other similar compounds.

As stated herein, a "metal nitride film" with various stoichiometries is a film in which a pure or impure metal and nitrogen are included by physical bonding, chemical bonding, and the like. As a specific example, a "titanium nitride film" and "TiNx" with various stoichiometries include all of the materials (TiOxNy) containing pure titanium nitride as well as impure titanium nitride including various stoichiometries and oxygen. A metal nitride film stated herein may be used as a barrier layer or a hard mask at the time of manufacturing a microelectronic device such as a circuit wiring of a MEMS, a display device, and a semiconductor device.

A "metal" stated herein includes a transition metal and a non-metal as well as an alkali metal and an alkaline earth metal.

An "alkyl" stated herein refers to a saturated straight or branched hydrocarbon chain radical consisting only of carbon and hydrogen atoms and attached to the remaining portion of a molecule by a single bond. An alkyl group of the present invention may preferably have 1 to 3 carbon atoms ($C_1$-$C_3$ alkyl), and specific examples thereof include methyl, ethyl, n-propyl, and 1-methylethyl (iso-propyl), and the like.

An "aryl" stated herein refers to a hydrocarbon ring-based radical including hydrogen, carbon atoms, and at least one aromatic ring. Exemplary aryl is a hydrocarbon ring-based radical including hydrogen, 6 to 12 carbon atoms, and at least one aromatic ring; a hydrocarbon ring-based radical including 6 to 9 carbon atoms, and at least one aromatic ring; and a hydrocarbon ring-based radical including hydrogen, 9 to 12 carbon atoms, and at least one aromatic ring.

An aryl radical stated herein may be a monocyclic, bicyclic, tricyclic, or tetracyclic ring-based radical which may include a fused or bridged ring-based radical. The aryl radical includes, but is not limited to, an aryl radical derived from benzene, biphenyl, indane, indene, and naphthalene.

The present invention is to provide an etching composition capable of selectively removing a metal nitride film used as a hard mask or the like. Specifically, the composition according to the present invention selectively etches the metal nitride film while effectively controlling an etch rate of a metal film. Thus, the etching composition according to the present invention has an excellent etch selection ratio by selectively etching the metal nitride film while preventing corrosion of a metal wiring film and a liner film.

The etching composition according to the present invention includes sulfuric acid, hydrogen peroxide, organic peroxide represented by the following Formula 1, and water, wherein a content of the organic peroxide is 0.001 to 3 wt % based on a total weight of the etching composition:

[Formula 1]

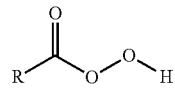

wherein

R is hydrogen, $C_1$-$C_3$ alkyl, or $C_6$-$C_{12}$ aryl.

The etching composition according to the present invention employs the organic peroxide represented by Formula 1 as an auxiliary oxidant in addition to the hydrogen peroxide as a main oxidant to increase an oxidation potential, such that it is possible to prevent a metal film from being etched and control an etch rate of the metal film. Therefore, it is possible to increase an etch selection ratio between the metal nitride film and the metal film.

Preferably, the etching composition according to an exemplary embodiment of the present invention does not include organic acid having a carboxylic acid group or a carboxylate functional group.

The etching composition according to the present invention may employ a combination of the hydrogen peroxide and the organic peroxide to have storage stability more excellent than that of an etching composition according to the related art having a combination of the hydrogen peroxide and the organic acid having the carboxylic acid group or the carboxylate functional group.

Specifically, since the organic acid having the carboxylic acid group or the carboxylate functional group, included in the etching composition according to the related art, is decomposed by the hydrogen peroxide over time, the etching characteristics of the etching composition are significantly deteriorated, and the degradation of the etching characteristics becomes serious when at most 5 days elapse.

On the other hand, since the etching composition according to the present invention includes the organic peroxide that is not decomposed by the hydrogen peroxide, storage stability of the etching composition is very excellent, such that the etching characteristics of the etching composition are maintained for a long period of time.

Preferably, the organic peroxide according to an exemplary embodiment of the present shows more excellent etching characteristics when R is hydrogen or lower alkyl, particularly alkyl having 3 or less carbon atoms in the above Formula 1. For example, the organic peroxide may be preferably peracetic acid, performic acid, perpropionic acid, or perbenzoic acid, and be more preferably peracetic acid or performic acid.

The etching composition according to an exemplary embodiment of the present invention may include the hydrogen peroxide and the organic peroxide to effectively control the etching of the metal film compared to the etching composition according to the related art including the hydrogen peroxide and the organic acid having the carboxylic acid group or the carboxylate functional group. Specifically, the organic peroxide included in the etching composition according to the present invention has a higher oxidation potential than that of the organic acid having the carboxylic acid group or the carboxylate functional group included in the etching composition according to the related art to oxidize a metal of the meta film to form a metal oxide film on the metal film, such that the etching of the metal film is controlled.

On the other hand, in the etching composition according to the related art including the organic acid having the carboxylic acid group or the carboxylate functional group, the metal film oxidized by the hydrogen peroxide is bonded to and is easily etched by components such as the sulfuric acid, such that the etching of the metal film might not be controlled. In other words, in the etching composition according to an exemplary embodiment of the present invention, at pH of 1 or less of the etching component, —C(O)OOH, which is a functional group of the organic peroxide, does not protect a surface of the metal film through coordination with the metal included in the metal film, and the etch rate of the metal film may be effectively adjusted by improving the oxidation potential of the metal included in the metal film using the auxiliary oxidant of the hydrogen peroxide which is the main oxidant to form the metal oxide film on the surface of the metal film. Furthermore, the organic peroxide according to the present invention represented by the above Formula 1 has etching characteristics improved compared to organic persulfate oxide.

Thus, the etching composition according to an exemplary embodiment of the present invention may have pH of 1 or less, and preferably have pH of 0.001 to 1 in order to have more excellent etching characteristics.

The organic peroxide and the hydrogen peroxide according to an exemplary embodiment of the present invention may preferably have a weight ratio of 1:2 to 55, and have a weight of 1:20 to 55 in order to obtain a more excellent etch selection ratio and form a metal oxide in a stable state on the surface of the metal film.

The etching composition according to an exemplary embodiment of the present invention may include 70 to 90 wt % of sulfuric acid, 0.5 to 5 wt % of hydrogen peroxide, 0.001 to 3 wt % of organic peroxide, and the remaining amount of water, more preferably, 80 to 90 wt % of sulfuric acid, 1 to 5 wt % of hydrogen peroxide, and 0.05 to 1 wt % of organic peroxide, and more preferably, 0.1 to 1 wt % of organic peroxide and the remaining amount of water.

The etching composition according to an exemplary embodiment of the present invention includes the organic peroxide, which improves the oxidation potential of the metal film to form the metal oxide on the metal film. Therefore, the etching composition according to an exemplary embodiment of the present invention may not include a separate anti-corrosion agent, and is thus very economical.

The etching composition according to an exemplary embodiment of the present invention may further include a known additive within a range recognizable by those skilled in the art.

As an example, the etching composition according to an exemplary embodiment of the present invention may further include one or two or more additional additives selected from an etch stabilizer, a fluorine-based compound, a glycol-based compound, and a pH adjusting agent.

In addition, the present invention is to provide an etching method of a metal nitride film using an etching composition according to the present invention, the method including: selectively etching a metal nitride film from a microelectronic device by bringing the etching composition according to the present invention into contact with the microelectronic device including the metal nitride film and a metal film.

In the etching method according to an exemplary embodiment of the present invention, the metal nitride film may include one or two or more selected from titanium nitride, tantalum nitride, and titanium tantalum nitride, and may be preferably a titanium nitride film.

A material of the metal film is not limited to a metal used for a wiring, but may be copper, cobalt, tungsten, or the like, as a preferable example, and be, preferably, tungsten.

Thus, the etching method according to an exemplary embodiment of the present invention may be preferably applied to the titanium nitride film and/or a tungsten film.

The etching method of a metal film using an etching composition according to the present invention may be performed according to a general method.

In addition, the present invention provides a method of manufacturing a microelectronic device including an etching process performed using an etching composition according to the present invention.

A pH of the present invention, which is a numerical value indicating a degree of acidity or alkalinity of a solution, is a value obtained by taking a commercial log for a reciprocal of a hydrogen-ion concentration, and was measured using a FEP-20 pH meter (METTLER TOLEDO).

Hereinafter, the present invention will be described in detail by Examples. However, the following Examples are only for illustrating the present invention, and contents of the present invention are not limited thereto.

EXAMPLES 1 TO 9 AND COMPARATIVE EXAMPLES 1 to 6

Etching compositions of Examples 1 to 9 and Comparative Examples 1 to 6 were prepared by mixing respective components with each other in component contents shown in Table 1 below.

an ellipsometer (available from J.A WOOLLAM Co. Ltd., M-2000U), which is an apparatus that measures a thickness of a thin film. The etching process was performed by immersing the wafer in each of the etching compositions of Examples 1 to 7 and Comparative Examples 1 to 6 maintained at an etching temperature of 90° C. within a bath for 1 minute. After the etching process was completed, the

TABLE 1

| Classification | Etchant Material | Content (wt %) | Oxidant Material | Content (wt %) | Organic peroxide, organic acid and organic persulfate oxide Material | Content (wt %) | Ultra-pure water | pH |
|---|---|---|---|---|---|---|---|---|
| Example 1 | Sulfuric acid | 88 | Hydrogen peroxide | 2.56 | Peracetic acid | 0.05 | remaining amount | 0.83 |
| Example 2 | Sulfuric acid | 88 | Hydrogen peroxide | 2.42 | Peracetic acid | 0.50 | remaining amount | 0.75 |
| Example 3 | Sulfuric acid | 88 | Hydrogen peroxide | 2.55 | Peracetic acid | 0.10 | remaining amount | 0.86 |
| Example 4 | Sulfuric acid | 88 | Hydrogen peroxide | 2.27 | Peracetic acid | 1.00 | remaining amount | 0.73 |
| Example 5 | Sulfuric acid | 88 | Hydrogen peroxide | 2.55 | Performic acid | 0.10 | remaining amount | 0.84 |
| Example 6 | Sulfuric acid | 88 | Hydrogen peroxide | 2.55 | Perpropionic acid | 0.10 | remaining amount | 0.82 |
| Example 7 | Sulfuric acid | 88 | Hydrogen peroxide | 2.55 | Perbenzoic acid | 0.10 | remaining amount | 0.85 |
| Example 8 | Sulfuric acid | 85 | Hydrogen peroxide | 3.55 | Perpropionic acid | 0.10 | remaining amount | 0.78 |
| Example 9 | Sulfuric acid | 90 | Hydrogen peroxide | 2.15 | Perpropionic acid | 0.10 | remaining amount | 0.81 |
| Comp. Example 1 | Sulfuric acid | 88 | Hydrogen peroxide | 2.58 | — | — | remaining amount | 0.89 |
| Comp. Example 2 | Sulfuric acid | 88 | Hydrogen peroxide | 1.00 | Peracetic acid | 5.00 | remaining amount | 0.68 |
| Comp. Example 3 | Sulfuric acid | 88 | Hydrogen peroxide | 2.56 | Citric acid | 0.05 | remaining amount | 0.85 |
| Comp. Example 4 | Sulfuric acid | 88 | Hydrogen peroxide | 2.56 | Triammonium citrate | 0.05 | remaining amount | 0.87 |
| Comp. Example 5 | Sulfuric acid | 88 | Hydrogen peroxide | 2.56 | Tert-butyl peroxybenzoate | 0.05 | remaining amount | 0.88 |
| Comp. Example 6 | Sulfuric acid | 88 | Hydrogen peroxide | 2.56 | Ammonium persulfate | 0.05 | remaining amount | 0.90 |

(Experimental Example 1) Measurement of Etching Speed of Titanium Nitride Film and Tungsten Film In order to confirm etching performance of the etching compositions prepared in Examples and Comparative Examples, a wafer in which a titanium nitride film is deposited on a tungsten film was prepared by performing deposition in the same manner as that of a semiconductor manufacturing process using chemical vapor deposition (CVD) and physical vapor deposition (PVD) methods.

Before starting an etching process, a thickness of the titanium nitride film and tungsten film was measured using wafer was washed with ultra-pure water, and a residual etchant and moisture were then dried completely using a drying apparatus.

In this case, the etching speed was calculated from a difference between thicknesses of the titanium nitride film and tungsten film before and after the etching process, using the ellipsometer (available from J.A WOOLLAM Co. Ltd., M-2000U). The results are shown in Table 2 below.

The results obtained from the methods of Experiments 1 and 2 are shown in Table 2 below.

TABLE 2

| | Initial etching speed | | | | Etching speed after being stored for 90 days | | | |
|---|---|---|---|---|---|---|---|---|
| Classification | TiN Etching speed (Å) | W Etching speed (Å) | Etch selection ratio of TiN/W | Hydrogen peroxide content (wt %) | TiN Etching speed (Å) | W Etching speed (Å) | Etch selection ratio of TiN/W | Hydrogen peroxide content (wt %) |
| Example 1 | 70.8 | 19.4 | 3.6 | 2.56 | 70.4 | 19.6 | 3.6 | 2.56 |
| Example 2 | 69.9 | 18.5 | 3.8 | 2.42 | 70.2 | 18.3 | 3.8 | 2.42 |
| Example 3 | 71.7 | 17.9 | 4.0 | 2.55 | 70.9 | 17.6 | 4.0 | 2.55 |
| Example 4 | 71.2 | 15.2 | 4.7 | 2.27 | 71.3 | 15.1 | 4.7 | 2.27 |
| Example 5 | 73.1 | 21.7 | 3.4 | 2.55 | 73.5 | 22.4 | 3.3 | 2.55 |

TABLE 2-continued

| | Initial etching speed | | | | Etching speed after being stored for 90 days | | | |
|---|---|---|---|---|---|---|---|---|
| Classification | TiN Etching speed (Å) | W Etching speed (Å) | Etch selection ratio of TiN/W | Hydrogen peroxide content (wt %) | TiN Etching speed (Å) | W Etching speed (Å) | Etch selection ratio of TiN/W | Hydrogen peroxide content (wt %) |
| Example 6 | 70.5 | 20.8 | 3.4 | 2.55 | 70.1 | 22.1 | 3.2 | 2.55 |
| Example 7 | 75.3 | 22.7 | 3.3 | 2.55 | 72.8 | 22.6 | 3.2 | 2.55 |
| Example 8 | 70.1 | 20.7 | 3.4 | 2.55 | 70.0 | 20.5 | 3.4 | 2.55 |
| Example 9 | 71.5 | 21.8 | 3.3 | 2.54 | 71.1 | 21.5 | 3.3 | 2.54 |
| Comp. Example 1 | 72.6 | 29.6 | 2.5 | 2.58 | 72.3 | 32.1 | 2.3 | 2.46 |
| Comp. Example 2 | 59.7 | 7.3 | 8.2 | 1.00 | 45.8 | 18.1 | 2.5 | 0.87 |
| Comp. Example 3 | 78.1 | 42.6 | 1.8 | 2.42 | 61.5 | 51.5 | 1.2 | 2.31 |
| Comp. Example 4 | 77.9 | 37.1 | 2.1 | 2.42 | 68.7 | 40.2 | 1.7 | 2.28 |
| Comp. Example 5 | 75.8 | 28.4 | 2.7 | 2.56 | 64.6 | 33.8 | 1.9 | 2.00 |
| Comp. Example 6 | 61.5 | 18.1 | 3.4 | 2.56 | 52.4 | 30.1 | 1.7 | 2.10 |

It may be seen from Table 2 that the etching composition according to the present invention includes a combination of hydrogen peroxide and organic peroxide, and the organic peroxide has a specific range of content, and thus, has a significantly higher etch selection ratio than those of the etching compositions according to Comparative Examples.

In addition, the etching composition according to the present invention may effectively suppress etching of a low-dielectric film such as a silicon nitride film, silicon oxide film or the like used as an insulating film by controlling an etch rate of the tungsten film, which is the metal film while effectively removing the titanium nitride film.

Specifically, the etching composition according to the present invention includes sulfuric acid, hydrogen peroxide, water, and organic peroxide having a controlled range of content as essential components, and thus, has an etch selection ratio significantly improved compared to Comparative Examples that do not include the essential components of the present invention.

The etching composition according to the present invention improves the etch selection ratio by controlling a content of organic peroxide.

In addition, it is determined that the etching composition according to the present invention includes a specific combination of the hydrogen peroxide and the organic peroxide, and the organic peroxide improves an oxidation potential as the auxiliary oxidant for the hydrogen peroxide to oxidize tungsten of the tungsten metal film to form a tungsten oxide film on the tungsten metal film, thereby controlling the etch rate of the tungsten metal film to improve the etch selection ratio. Accordingly, a separate anti-etching agent is not required.

On the other hand, in an etching composition according to Comparative Example 1, an etch selection ratio was low, and a content of hydrogen peroxide after the etching composition was stored for 90 days was reduced, such that storage stability of the etching composition was low, and in an etching composition according to Comparative Example 2, an etch selection ratio was excellent, but a storage stability of the etching composition was significantly reduced, such that etching characteristics of the etching composition after the etching composition was stored for 90 days were significantly deteriorated. In addition, in etching compositions according to Comparative Examples 3 to 5, low etching speed and selection ratios were low. It is determined that citric acid, triammonium citrate, and tert-butyl peroxybenzoate as organic acids included in the etching compositions according to Comparative Examples 3 to 5, do not form the tungsten oxide film through oxidation of tungsten, unlike the organic peroxide according to the present invention.

Furthermore, it may be seen that the etching composition according to the present invention has an etch selection ratio and storage stability improved compared to Comparative Example 6 using organic persulfate oxide.

The etching composition according to the present invention may selectively etch the metal nitride film while efficiently controlling an etch rate of the metal film.

In addition, the etching composition according to the present invention effectively suppresses the etching of the metal film to prevent corrosion of the metal wiring film and the liner film. Therefore, the etching composition according to the present invention does not require a separate anti-etching agent, and is thus very economical.

In addition, the etching method of a metal nitride film using an etching composition according to the present invention may control the etch selection ratio by controlling the etch rate of the metal film while improving the etching speed of the metal nitride film using the etching composition according to the present invention, and improve etching characteristics.

Further, the etching method of a metal nitride film using an etching composition according to the present invention does not generate corrosion of the metal wiring film and the liner film even if a metal wiring process is performed using the liner because a width of the wiring becomes thin in a metal wiring forming process.

Furthermore, the etching composition according to the present invention may prevent a change in a content of hydrogen peroxide, a change in pH of the etching composition, and a change in etching performance due to decomposition of the hydrogen peroxide, and may have very excellent storage stability to maintain excellent etching characteristics for a long period of time.

In addition, the etching composition according to the present invention may effectively remove the etching residue to minimize problems caused by the etch residue after the etching.

Thus, the method of manufacturing a microelectronic device including an etching process performed using the etching composition according to the present invention may increase productivity with excellent reliability.

It will be obvious to those skilled in the art to which the present invention pertains that the present invention is not limited to the above-mentioned exemplary embodiments and the accompanying drawings, but may be variously substituted, modified, and altered without departing from the scope and spirit of the present invention.

The invention claimed is:

1. An etching composition comprising:
sulfuric acid, hydrogen peroxide, organic peroxide represented by the following Formula 1, and water,
wherein a content of the organic peroxide is 0.001 to 3 wt % based on a total weight of the etching composition:

[Formula 1]

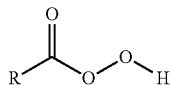

wherein

R is hydrogen, $C_1$-$C_3$ alkyl, or $C_6$-$C_{12}$ aryl, and wherein the etching composition includes 70 to 90 wt % of sulfuric acid, 0.5 to 5 wt % of hydrogen peroxide, 0.001 to 3 wt % of organic peroxide, and the remaining amount of water.

2. The etching composition of claim 1, wherein the organic peroxide is peracetic acid, performic acid, perpropionic acid, or perbenzoic acid.

3. The etching composition of claim 1, wherein the organic peroxide and the hydrogen peroxide have a weight ratio of 1:2 to 55.

4. The etching composition of claim 1, further comprising one or two or more additional additives selected from an etch stabilizer, a fluorine-based compound, a glycol-based compound, and a pH adjusting agent.

* * * * *

UNITED STATES PATENT AND TRADEMARK OFFICE
CERTIFICATE OF CORRECTION

PATENT NO. : 11,091,695 B2  
APPLICATION NO. : 16/855864  
DATED : August 17, 2021  
INVENTOR(S) : Hye Hee Lee et al.

Page 1 of 1

It is certified that error appears in the above-identified patent and that said Letters Patent is hereby corrected as shown below:

On the Title Page

Item (72), add:  
Pilgu KANG, Icheon-si (KR), Yunsun CHOI, Icheon-si (KR), and Munki HONG, Icheon-si (KR).

Signed and Sealed this  
Twenty-first Day of December, 2021

Drew Hirshfeld  
*Performing the Functions and Duties of the*  
*Under Secretary of Commerce for Intellectual Property and*  
*Director of the United States Patent and Trademark Office*